United States Patent
Weiland et al.

(10) Patent No.: US 7,622,936 B2
(45) Date of Patent: Nov. 24, 2009

(54) CONTACT DEVICE FOR TOUCH CONTACTING AN ELECTRICAL TEST SPECIMEN, AND CORRESPONDING METHOD

(75) Inventors: Achim Weiland, Hildrizhausen (DE); Gunther Böhm, Nufringen (DE)

(73) Assignee: Feinmetall GmbH, Herrenberg (DE)

( * ) Notice: Subject to any disclaimer, the term of this patent is extended or adjusted under 35 U.S.C. 154(b) by 0 days.

(21) Appl. No.: 12/002,481

(22) Filed: Dec. 17, 2007

(65) Prior Publication Data

US 2008/0150568 A1    Jun. 26, 2008

(30) Foreign Application Priority Data

Dec. 19, 2006  (DE)  ........................ 10 2006 062 391
Nov. 30, 2007  (DE)  ........................ 10 2007 057 815

(51) Int. Cl.
*G01R 31/02*    (2006.01)
*G01R 31/28*    (2006.01)

(52) U.S. Cl. ...................... 324/754; 324/760; 324/158.1

(58) Field of Classification Search ........................ None
See application file for complete search history.

(56) References Cited

U.S. PATENT DOCUMENTS

| | | | |
|---|---|---|---|
| 6,150,830 A * | 11/2000 | Schmid et al. | 324/761 |
| 6,420,888 B1 * | 7/2002 | Griffin et al. | 324/754 |
| 6,747,447 B2 | 6/2004 | Markert et al. | |
| 7,164,280 B2 | 1/2007 | Bohm | |
| 7,339,385 B2 * | 3/2008 | Takasu et al. | 324/754 |
| 2005/0264312 A1 * | 12/2005 | Bohm et al. | 324/761 |

OTHER PUBLICATIONS

Chinese First Office Action in the parallel case (App. No. CN 2007 10159823.9, issued Aug. 21, 2009).

* cited by examiner

*Primary Examiner*—Ha Tran T Nguyen
*Assistant Examiner*—Roberto Velez
(74) *Attorney, Agent, or Firm*—Harness, Dickey & Pierce, P.L.C.

(57) ABSTRACT

A contacting device for touch contacting an electrical test specimen includes a contact head and a connecting device. The contact head with the test specimen have electrically touch contactable test contacts, the positions of which are distributed across a testing surface and are determined by at least one guide element that belongs to the contact head and that is fastened to a holding device of the contact head. The test contacts, on their side facing away from the test specimen, are to be brought into electrical touch contact with contact surfaces of the connecting device. It is provided that the guide element is composed of individual segments that each have a part of the testing surface and are each connected to at least one of the holding device and the connecting device by at least one fixed bearing.

29 Claims, 3 Drawing Sheets

CONTACT DEVICE FOR TOUCH CONTACTING AN ELECTRICAL TEST SPECIMEN, AND CORRESPONDING METHOD

CROSS-REFERENCE TO RELATED APPLICATIONS

This application claims the benefit of DE 10 2006 062 391.6, filed Dec. 19, 2006. The disclosure of the above application is incorporated herein by reference.

FIELD

The present disclosure generally relates to a contacting device for touch contacting an electrical test specimen. More particularly, the present disclosure relates to a contacting device for touch contacting a wafer.

BACKGROUND

The statements in this section merely provide background information related to the present disclosure and may not constitute prior art.

Contacting devices, which can also be called vertical test cards, essentially comprise a contact head, which bears the test contacts, (also called contact elements), and a connecting device (connector or connector head), which produces the electrical connection between the test contacts and a testing device (tester). The contact head is mounted on the connecting device. The ends of the test contacts that face the contacting device touch contact surfaces of the connecting device. The ends of the test contacts that face away from the connecting device touch contact a test specimen, in particular a wafer. Thus overall it is possible by means of the testing device to produce electrical connection paths to the test specimen and to test the latter for electrical function. The connecting device (connector) preferably comprises a printed circuit board and where necessary a so-called stiffener, that is, a stiffening element, that can absorb the contacting forces when the test specimen is contacted without the printed circuit board becoming bent. The printed circuit board has the aforesaid contact surfaces, that is, the test contacts of the contact head can contact the corresponding contact surfaces of the printed circuit board directly. This is also known as the "direct attach" structure. Alternatively it is also possible for the printed circuit board to be contacted by the test contacts via intermediate wires that are used for routing. This is called a wired connecting head, that is a wired connecting device that is also known as a "wired connector". The area (contact surface) to be contacted on the connecting device is very small. In particular it has a diameter between 50 µm and 300 µm. This small diameter is due to the fact that the test contacts are very close to one another, for instance at mean intervals ranging from 50 µm to 250 µm, corresponding to the arrangement of the pads (contact pads) to be contacted on the test specimen, in particular a wafer. The arrangement of the contact surfaces on the connecting device, in particular the printed circuit board (PCB), is the same as the corresponding contact pad arrangement on the test specimen, in particular a wafer, up to any minor differences that are present due to the smallest possible incline of the test contacts. However, if the test contacts do not run on an incline but rather are aligned vertically, the mean intervals from the contact pads to the test specimen are approximately equal to the mean intervals from the contact surfaces to the connecting device. In order now to be able to electrically connect the aforesaid testing device to the connecting device, the connecting device takes on an increase in the contact intervals in that its contact surfaces associated with the test head lead to contact surfaces that are far enough apart from one another that can be connected to the testing device with no problem. The contact surfaces that contact the test contacts are preferably disposed on the one side of the printed circuit board and the contact surfaces that contact the testing device are disposed on the other side of the printed circuit board.

All of the information in the foregoing applies to known contacting devices and also to contacting devices for the invention. It is clear that touch contacting the test contacts (contact elements) to the associated contact surfaces of the connecting device can be problematic when there is no alignment but rather for instance all of the test contacts or individual test contacts are positioned offset to the associated contact surfaces on the connecting device, that is, no electrical contacting is attained. This offset can be caused for instance due to variations in temperature.

SUMMARY

The underlying object of the invention is therefore to configure a contacting device of the type cited in the foregoing that has greater assured contact.

According to one particular aspect, the present teachings provide a contacting device for touch contacting an electrical test specimen. The electrical test specimen may be a wafer. The contacting device may have a "Kontaktkopf", which can also be called a contact head, and a connecting device, also called a connector. The contact head with the test specimen may have electrically touch contactable test contacts, the positions of which are distributed across a testing surface and are determined by at least one guide element (guide plate on the tester side) that belongs to the contact head and that is fastened to a holding device, also called a spacer, of the contact head. The test contacts, on their side facing away from the test specimen, are to be brought into electrical touch contact with contact surfaces of the connecting device (connector, which can be embodied in particular as a printed circuit board).

A guide element of the present disclosure may be composed of individual segments that each have a part of the testing surface and that are each connected by at least one fixed bearing to the holding device and/or connecting device. Due to the guide element composed of individual segments, there are fewer test contact positioning errors relative to the contact surfaces of the connecting device because at different temperatures the expansion behavior is not added over the entire testing surface but rather acts separately only in the individual segment, which segment has smaller dimensions than the entire guide element and therefore changes in length brought about by variations in temperature are not as pronounced. The result is assured touch contacting between test contacts and the contact surfaces of the connecting element. According to certain embodiments, there are preferably at least two individual segments.

In accordance with one further aspect of the present disclosure, it is provided that the holding device has a retaining ring and the testing surface is disposed therein. Testing surface shall be construed to mean the geometric area in which the test contacts are located within which the test specimen can thus be contacted.

It is advantageous when at least one of the individual segments is connected to the retaining ring by means of its fixed bearing. The individual segment is thus held on the retaining ring at the fastening point of the fixed bearing, that is, longitudinal expansions due to changes in temperature proceed from the fastening point: they are zero at the fastening point and increase with distance from the fastening point, but run only to the edge of the individual segment, this distance being correspondingly small due to the segmentation of the guide element and thus potential offsets caused by variations in temperature remain small.

It is advantageous when the retaining ring has a circular or rectangular, in particular square, outline. The retaining ring can in particular be a complete ring or a partial ring. A complete ring is a closed ring; a partial ring is not closed. Of course it is also possible for the retaining ring to be formed from a plurality of partial rings.

One further aspect of the present teachings provides at least one individual segment, that is connected to the retaining ring and forms an outer individual segment, and at least one individual segment, that is located inside the retaining ring but is not connected or is not directly connected to the retaining ring and forms an inner individual segment. The at least one outer individual segment is thus connected via a fixed bearing to the retaining ring and the at least one inner individual segment is not connected to the retaining ring but rather is held in particular by the at least one outer retaining element and/or is held by another element that is itself connected to the retaining ring. Alternatively it is also possible for only outer individual segments to be present.

In accordance with another further aspect of the present teachings it is provided that the holding device has a holding rib to which at least one inner individual segment is fastened by means of at least one fixed bearing. This holding rib can preferably be fastened to the retaining ring. The holding rib preferably runs transversely through the ring structure of the retaining ring, specifically along a diagonal of the retaining ring.

It is advantageous when at least one floating bearing is associated with each individual segment. Consequently each individual segment is held with at least one fixed bearing and has at least one floating bearing that permits relative movement, that is, permits a longitudinal shift by the corresponding individual segment, preferably in at least one preferred direction, in particular in only one preferred direction. This is how longitudinal changes in each individual segment, which are caused by variations in temperature, are controlled.

In accordance with another further aspect of the present teachings, the floating bearing is embodied between at least one individual segment and the holding device and/or the connecting device on the one hand and/or between at least one individual segment and at least one other individual segment on the other hand. The floating bearing connection is thus present between the corresponding individual segment and the holding device or connecting device and/or between the individual segment and a preferably adjacent other individual segment.

The fixed bearing is preferably embodied as a clearance-free fastening, in particular pinning, in the testing surface. In addition, the clearance-free fastening does not permit any relative movements, regardless of direction, at the fastening point of the floating bearing.

The floating bearing is in particular embodied as a fastening, in particular pinning, that is provided with clearance in only one direction in the testing surface. Given a movement that occurs due to variations in temperature, it is thus deflected in this one direction. If pinning is selected for the fastening, it is not clearance-free on all sides but rather has some clearance in the one direction that permits movement (for instance pin in an elongated hole).

In accordance with another further aspect of the present teachings, it is provided that an imaginary connecting line or an extension of an imaginary connecting line runs between the fixed bearing and the floating bearing of each of the outer individual segments or approximately through a center point of the testing surface, the clearance for the associated floating bearing existing only in the direction of the connecting line. The consequence of this embodiment is that longitudinal changes due to variations in temperature in each of the individual segments run radially or approximately radially with respect to the center point.

It is advantageous when the fixed bearing of the at least one inner individual segment is disposed in or approximately in the center point of the testing surface. The inner individual segment is preferably arranged centrally or approximately centrally with respect to the geometric expansion of the testing surface, the individual segment also being fastened centrally by means of the associated fixed bearing, specifically in the center or approximately in the center of the testing surface.

In accordance with another further aspect of the present teachings, it is provided that the fastening that is provided with clearance in only one direction in the testing plane and that forms the floating bearing is formed as a projection/recess connection, in particular for areas of the guide element, between the one individual segment and the other individual segment. The floating bearing is thus formed by the interleaving of two individual segments in that the one individual segment has a projection that engages in a recess of the other individual segment, in particular with no clearance, in particular transverse to the engagement direction and with no clearance. There can be clearance in the engagement direction, that is, the projection can engage more or less deeply in the recess so that shifts in position are possible in the engagement direction.

In accordance with another further aspect of the present teachings, it is provided that the guide element has a temperature expansion coefficient that differs from that of the connecting device. The temperature expansion coefficients for the components and/or materials used in the contacting device are different. In addition, these components and/or materials reach different temperatures during testing of a test specimen so that position errors for the individual components relative to one another occur, in particular in the aforesaid touch interface between contact head and connecting device. On the other hand, if components/materials that have different temperature expansion coefficients are selected for the guide element on the one hand and for the connecting device on the other hand, the aforesaid parameters, for instance the different heating of different locations of the contacting device, are completely or partially compensated, and the result is that there are no alignment errors or only minor alignment errors that do not hinder touch contacting. In particular it can be provided that the holding device has a different temperature expansion coefficient from the guide element. In particular it can be provided that the sum of the temperature expansion coefficients of the guide element and holding device are equal to or approximately equal to the temperature expansion coefficient of the connecting device. In this manner offset errors can be avoided or minimized.

In accordance with another further aspect of the present teachings, it is provided that the temperature expansion coefficient of the holding device is selected such that touch contacting within a temperature range is possible between the test contacts and the contact surfaces of the connecting device. This ensures reliable contacting.

As stated in the foregoing, the connecting device can be embodied as a circuit board, in particular as printed circuit board.

The arrangement is preferably made in that the contact surfaces are made from conductor surfaces of the printed surface board. The test contacts can preferably be embodied as test needles, in particular buckling test needles. "Buckling test needles" shall be construed to mean test needles that can buckle laterally, that is, they have inherent elasticity, so that differences in contact levels are equalized and furthermore it is possible to obtain corresponding contact pressure.

In particular it is provided that the guide element is embodied as a guide plate, and consequently this is a planar structure.

The invention furthermore relates to a method for touch contacting an electrical test specimen, in particular a wafer, having a "Kontaktkopf" (contact head) and a connecting device (connector), the contact head with the test specimen having electrically touch contactable test contacts, the positions of which are distributed across a testing surface and are determined by at least one guide element (guide plate on the tester side) that belongs to the contact head and that is fastened to a holding device (spacer) of the contact head, and wherein the test contacts, on their side facing away from the test specimen, are to be brought into electrical touch contact with contact surfaces of the connecting device (connector, printed circuit board), the guide element being composed of individual segments that each have a part of the testing surface and are each connected to the holding device and/or the connecting device by means of at least one fixed bearing.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way. The drawings illustrate the invention using exemplary embodiments as follows.

DETAILED DESCRIPTION

Figure 1:
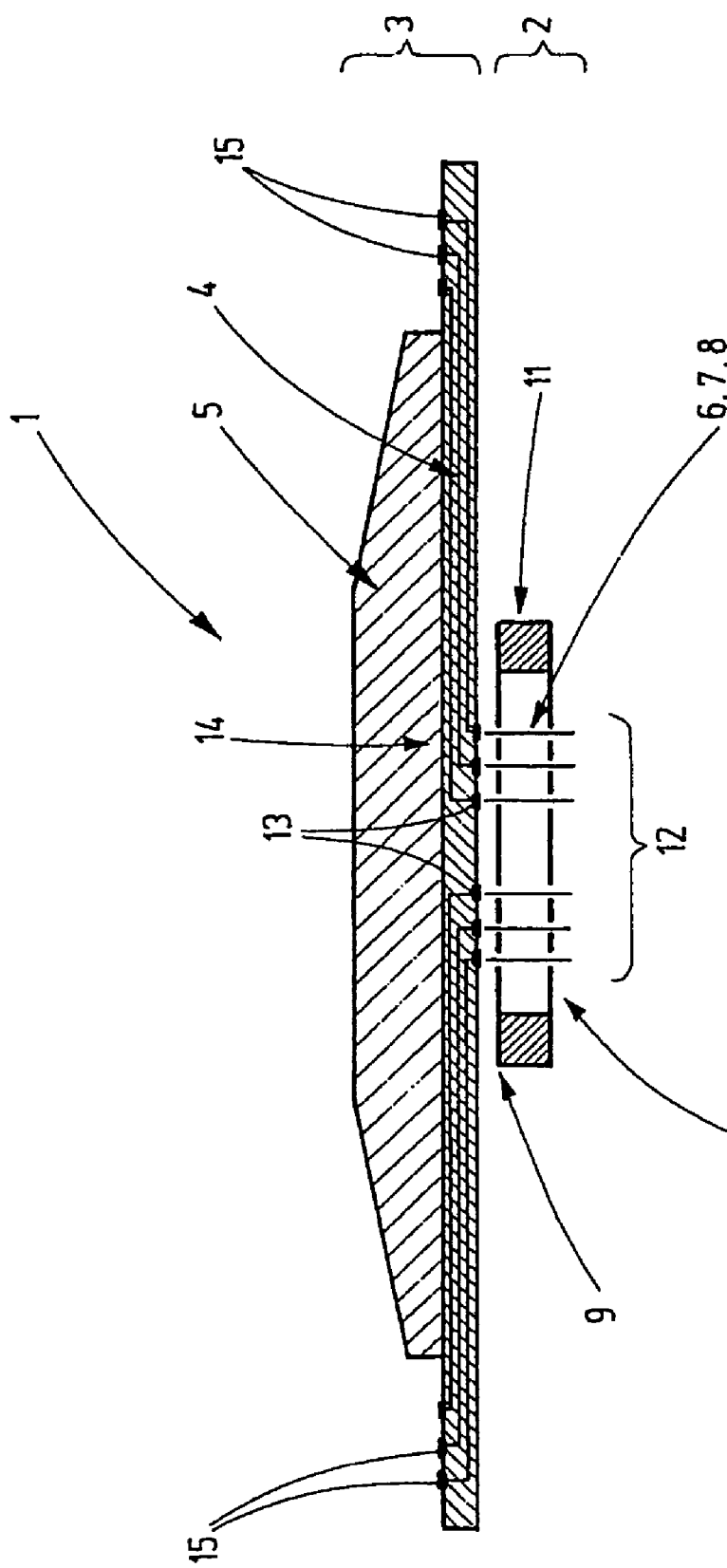
FIG. 1 is a schematic sectional view through a contacting device.

The following description is merely exemplary in nature and is not intended to limit the present disclosure, application, or uses. It should be understood that throughout the drawings, corresponding reference numerals indicate like or corresponding parts and features.

FIG. 1 depicts a contacting device 1 that is embodied as a vertical test card in a direct attach structure. A section of the contacting device 1 is depicted that has a contact head 2 and a connecting device 3. The connecting device 3 has a printed circuit board 4. Moreover, a stiffening element 5 can be associated with it. The contact head 2 has a plurality of test contacts 6 that are embodied as test needles 7, in particular buckling test needles 8, and that are held longitudinally displaceable in guide holes by guide elements 9, 10. The guide element 9 is a guide element on the tester side because it is disposed on the tester side of the contacting device 1 and it is thus associated with the connecting device. The guide element 11 associated with the test specimen and is thus disposed facing away from the connecting device 3. A holding device 11 is arranged between the guide elements 9 and 10. The test contacts 6 are arranged across a surface that represents a testing surface 12. The ends of the test contacts 6 associated with the connecting device 3 are in touch contact with contact surfaces 13 of the connecting device 3, in particular conductors 14 of the printed circuit board 4. The conductors 14 lead to contact surfaces 15 that can be connected to a test device (not shown). The contact surfaces 13 are disposed on the one side of the printed circuit board 4 and the contact surfaces 15 are disposed on the other side. The ends of the test contacts 6 facing away from the connecting device 3 can be brought into touch contact with a test specimen (not shown), in particular a wafer, which in particular occurs in that the test specimen is moved toward the contacting device 1 in order by means of the testing device to wire current paths to the test specimen and to test it to ensure that it is functioning correctly. The mean intervals between the test contacts 6 range from 50 µm to 250 µm, that is, they are very close to one another, and this is consequently also true of the contact surfaces 13. Due to the very small dimensions it is of particularly significant that the ends of the test contacts 6 associated with the contacting device 1 meet or are positioned against the contact surfaces 13 associated with them when a test specimen is being tested in order to be able to create the current paths for the test. Lateral offsets can occur due to variations in temperature so that contacting certain test contacts 6 with the associated contact surfaces 13 is no longer possible. A remedy for this is provided in accordance with the invention. This will be discussed in greater detail in the following. In order to be able to connect the testing device to the contact surfaces 15 of the connecting device 3 with no problem, the latter are disposed with larger mean intervals than the contact surfaces 13.

Figure 2:
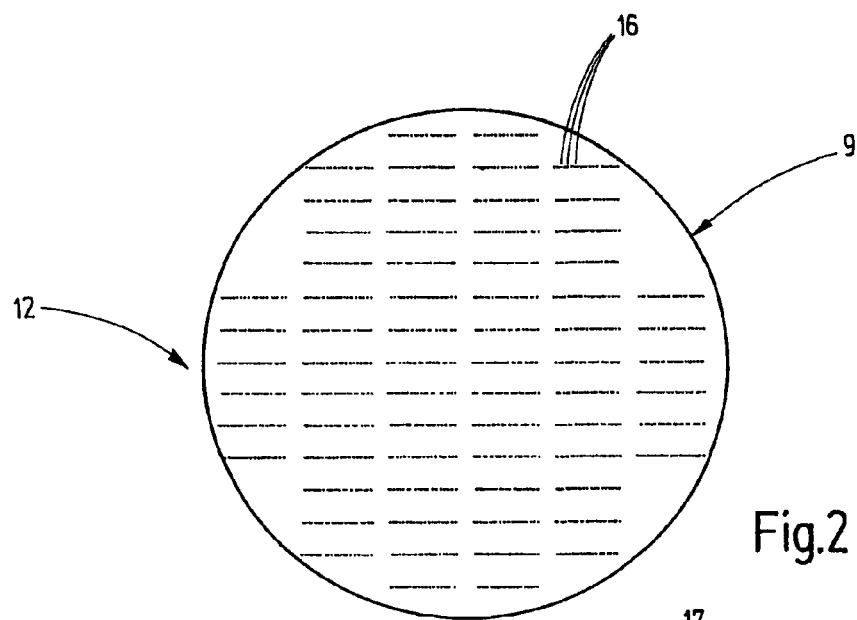
FIG. 2 is a top view of a guide element of a contacting element known from the prior art.

FIG. 2 depicts a top view of the guide element 9, which is embodied in a single piece in accordance with the structure previously known from the prior art. It has a plurality of bores 16 for receiving the test contacts 6. The bores 16 are arranged in rows and are positioned very close to one another.

Figure 3:
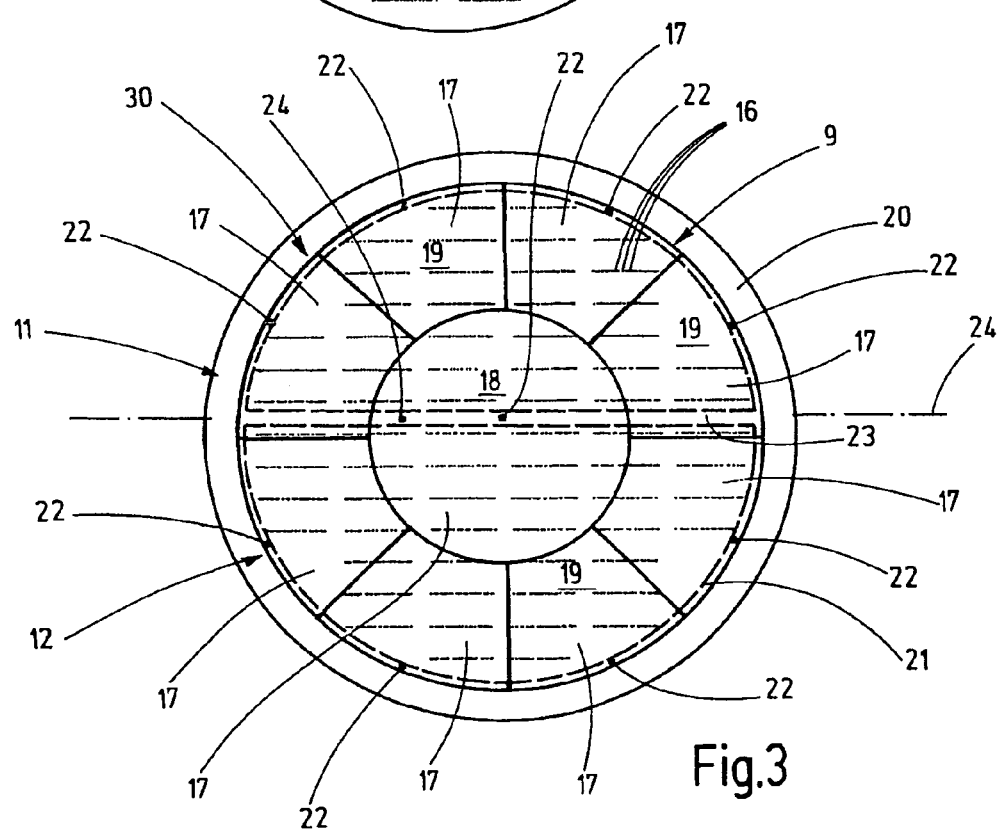
FIG. 3 is a top view of a guide element having a holding device (spacer), not heated.

In contrast to FIG. 2, FIG. 3 depicts a corresponding arrangement of bores 16 in the guide element 9, the guide element 9 however being inventively composed of a plurality of individual segments 17, that is, this is a multi-part arrangement. In the exemplary embodiment in FIG. 3 there are a total of nine individual segments 17. These include a circular inner individual segment 18 that is surrounded by eight outer individual segments 19. Consequently the outer individual segments 19 each have largely wedge-shaped outlines, the tip of each wedge-shape being missing, however, because this is where the inner individual segment 18 is located. Consequently the side of the outer individual segments 19 that is associated with the inner individual segment 18 is curved. A testing surface 12 that is circular overall is formed in this manner.

In accordance with FIG. 3, the holding device 11 is embodied as a retaining ring 20 that inwardly overlaps the outer edge areas of the outer individual segments 19. Located in this overlap zone 21 formed in this manner are fixed bearings 22 that connect each associated outer individual segment 19 to the holding device 11 with no clearance and so that it cannot be dislodged. Each clearance-free attachment is produced by means of pinning. Each outer individual segment 19 has only one fixed bearing 22.

The holding device 11 has a holding rib 23 that is fastened to the retaining ring 20 and that runs along a retaining ring diagonal 24'. The inner individual segment 18 also has a fixed bearing 22 that is located in the center of the circular testing surface 12 and that also represents clearance-free attachment that exists with the holding rib 23, that is, the inner individual segment 18 is connected with no clearance to the holding rib 23 via the fixed bearing 22. This lack of clearance for all of the fixed bearings 22 exists in each direction within the testing surface 12.

In addition to a fixed bearing 22, each of the individual segments 17 has a floating bearing 24. In accordance with FIG. 3, the floating bearing 24 that is located spaced apart from the fixed bearing 22 of the individual segment 18 in the inner individual segment 18 is formed by a connection to the holding rib 23, which is also embodied as a pinning, the pin fastened to the holding rib 23 engaging in an elongated hole of the inner individual segment 18 so that there is a one-dimensional guide. The elongated hole extends in the direction of an imaginary connecting line between the fixed bearing 22 and the floating bearing 24 of the inner individual segment 18. The outer individual segments 19 also each have a floating bearings 24. However, these floating bearings 24 are not shown in FIGS. 3 and 4. FIG. 5 goes into greater detail regarding the floating bearing 24 of the outer individual segments 19.

Figure 4:
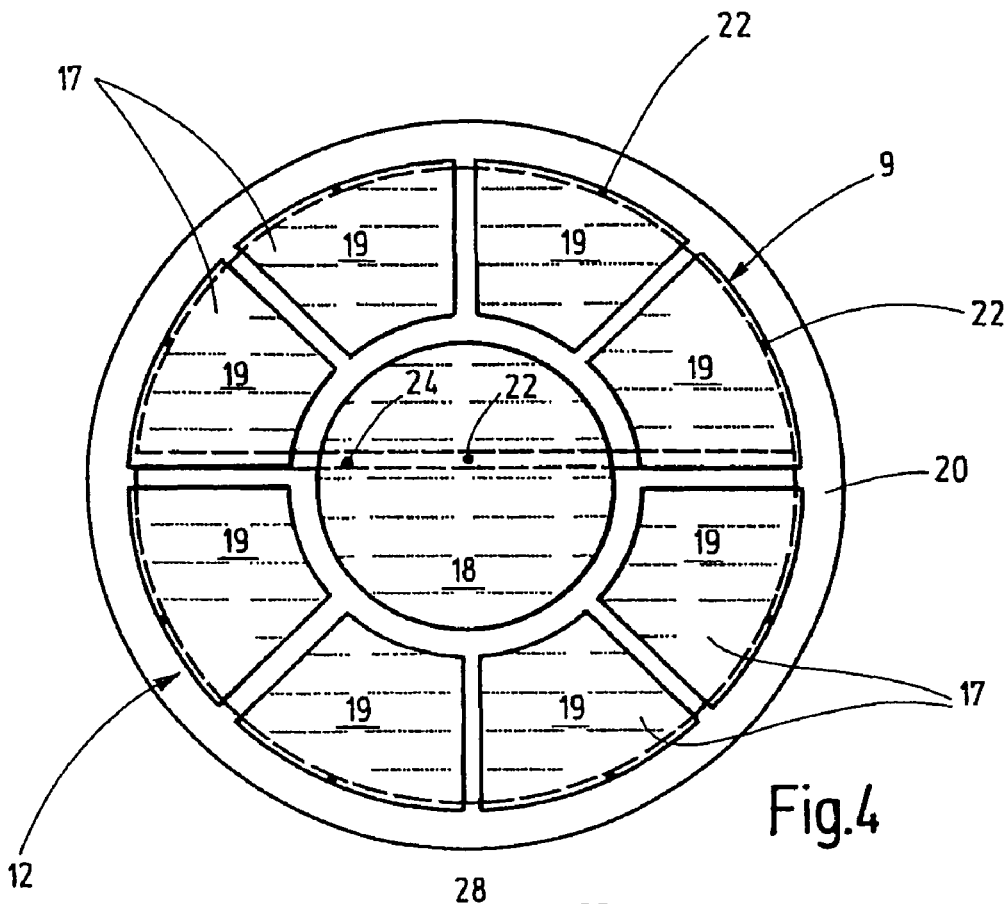
FIG. 4 is the same as FIG. 3, but heated.
Figure 5:
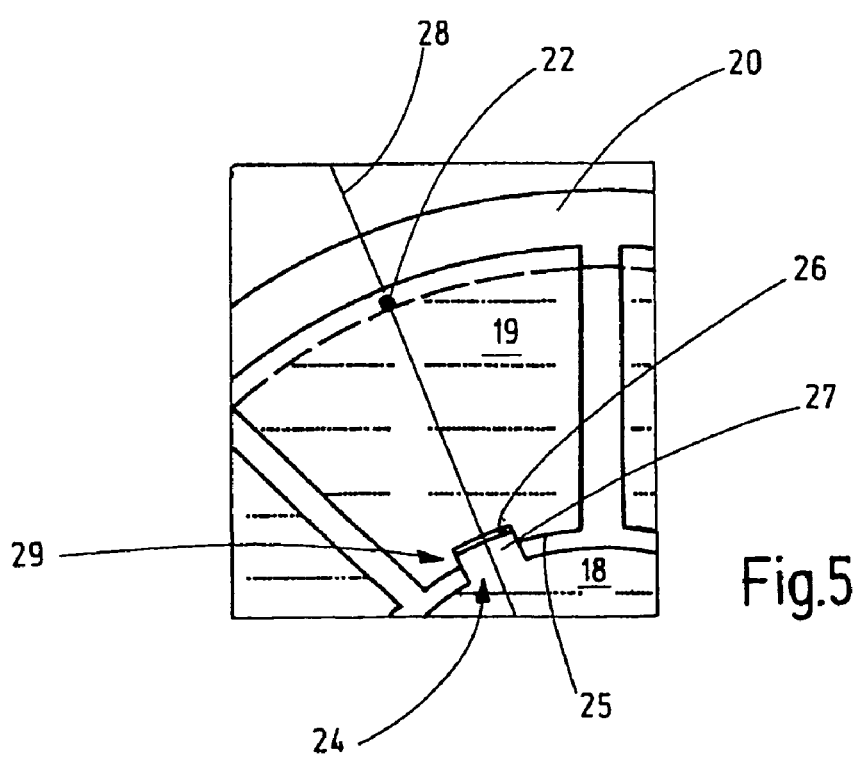
FIG. 5 is a partial elevation of an area in FIG. 4.

In accordance with FIG. 5, which depicts a detail from the arrangement in accordance with FIGS. 3 and 4, each outer individual segment 19 has the fixed bearing 22 and the aforesaid floating bearing 24. The floating bearing 24 is formed in that embodied on one side 25 of each outer individual segment 19 associated with the inner individual 18 is a recess 26 into which a projection 27 of the inner individual segment 18 engages such that a one-dimensional guide is formed. This one-dimensional guide exists along an imaginary connecting line 28 that connects the fixed bearing 22 to the floating bearing 24 of the outer individual segment 19 in question. Transverse thereto there is a clearance-free connection between the outer individual segment 19 in question and the inner individual segment 18, that is, the projection 27 does not have any lateral clearance in the associated recess 26. Overall each outer individual segment 19 is connected in the manner described via a projection/recess connection 29 to the inner individual segment 18, each projection/recess connection 29 being formed by one projection 27 and one recess 26. The arrangement is always created such that the fixed bearing 22 and the floating bearing 24 of each outer individual segment 19 are spaced apart from one another, each imaginary line 28 to be created intersecting the center of the testing surface 12 or passing in the vicinity of the center of the testing surface 12.

A comparison of FIGS. 3 and 4 indicates that there are different intervals between adjacent outer individual segments 19 and also different intervals between the outer individual segments 19 and the inner individual segment 18. These offsets result from the effects of different temperatures, that is, the arrangement in FIG. 3 occurs at "normal temperature", while the arrangement in FIG. 4 is present when it is heated. It should be noted that during the testing of a test specimen there are significant temperature loads, the different materials of the contacting device 1 reaching different temperatures. The tests take place in wide temperature ranges, for instance from −40° C. to +150° C. (temperature of the test specimen to be contacted, especially a wafer); in individual cases the temperatures can be even higher or lower. The contacting device 1 absorbs some of the temperatures of the test specimen, temperature gradients forming within the contacting device 1, especially in the direction from the test specimen to the testing device (tester). Normally the tester side of the contacting device 1 is only exposed to room temperature.

Relatively small surface area units are created due to the inventive separation of the guide element 9 that is associated with the connecting device 3 so that longitudinal changes, for instance of an outer individual segment 19, that occur due to variations in temperature, are not so noticeable that the associated test contacts 6 no longer contact the contact surfaces 13 of the connecting device 3. Much larger offsets occur with the guide element 9 from the prior art (FIG. 2) because deviations as seen across the diameter of the testing surface 12, that is across a large surface area, add up to much more. In the invention (FIG. 3), on the other hand, each fixed bearing 22 ensures that the associated individual segment 17 is held rigidly at the location of the fixed bearing 23 and can shift in the one-dimensional direction defined by the associated floating bearing 24, the shifts being relatively small because the individual surfaces of the individual segments 17 are themselves small.

As stated in the foregoing, there is also the fact that the components of the contacting device 1 comprise different materials that have different temperature expansion coefficients. Since these materials or components reach different temperatures in the test, the individual components experience displacements relative to one another, as has already been explained in the foregoing. Even when the centers of the guide element 9 and the connecting device 3 are precisely aligned at different temperatures, that is, the test contacts 6 correspond to the associated contact surfaces 13 of the connecting device 3 in the area of the center, there can be deviations on the edge of the testing surface 12 so that in the known embodiment of the prior art (FIG. 2) the edge-side test needles 7 no longer meet the associated contact surfaces 13. However, since in accordance with FIG. 3 an individual segment structure is attained with the invention, such major differences in length do not occur and thus assured contacting occurs. This is the case even with very large test patterns (testing surfaces 12), such as for instance 100 mm to 320 mm diameter.

Preferably the arrangement is made such that the guide element 9 has a different temperature expansion coefficient than the connecting device 3. In addition or alternatively, it can preferably be provided that the holding device 11 has a temperature expansion coefficient that is different from the guide element 9. Preferably the arrangement is made such that the total of the temperature expansion coefficients of the guide element 9 and holding device 11 is equal to or approximately equal to the temperature expansion coefficient of the connecting device 3. What this leads to is that the aforesaid components experience equivalent longitudinal changes at different temperatures so that it is assured that the test contacts 6 always contact the contact surfaces 13. This means that the temperature expansion coefficient of the holding device 11 is selected such that within a temperature range the touch contacting between the test contacts 6 and the contact surfaces 13 of the connecting device 3 are maintained.

The connecting device 3, in particular the printed circuit board 4, typically has a very large temperature expansion coefficient (approximately 12 ppm/K to 18 ppm/K), while the guide element 9 has a much smaller expansion coefficient of approximately 2 ppm/K to 12 ppm/K, typically 4 ppm/K (K=Kelvin).

The invention therefore overall provides a multipart guide arrangement, specifically the guide element 9, that is retained on the holding device 1 and that is preferably embodied as a guide plate 30. The inventive segment structure (individual segments 17) is selected in order to adapt the size/position of the guide element 9 at different temperatures to the size of the connecting device 3, in particular the printed circuit board 4. Each individual segment 17 is connected to the holding device 11, in particular is pinned, at discretely selected locations. What this affects is that the position of the individual segments 17 relative to one another is determined by the temperature expansion coefficient and the absolute temperature of the holding device 11. The material of the holding device 11 is selected such that its temperature expansion coefficient is optimal for minimizing position errors at given temperatures of the contact partners (after the temperature of the entire system has been controlled). Suitable materials are available for this, in particular nickel-containing expansion alloys.

The following is provided for positioning the individual segments 17. The central element (inner individual segment 18) is fastened via two centering pins directly to the holding rib 23, which represents a brace for the holding device 11. One of the two pins acts as a fixed bearing in that it cooperates with an adapted circular hole, and the other acts as a floating bearing in that it cooperates with an elongated hole. The pin acting as a fixed bearing 22 is preferably arranged in the vicinity of the center of the testing surface 12. One of the fixed bearing/floating bearing arrangements is also available for each of the other segments, that is, the outer individual segments 19. Each fixed bearing 22 is formed by means of a centering pin in the holding device 11 and a circular bore in the associated individual segment 19 and the floating bearing 24 is formed by a one-dimensional guide to the central, inner individual element 18. An imaginary line 28 between a fixed bearing 22 and the associated floating bearing 24 for the individual segment 19 must run through or approximately through the centrally arranged fixed bearing 22 of the inner individual element 18. The slide surfaces of the one-dimensional guides formed by the floating bearings 24 must each run parallel or approximately parallel to this line 28.

A circular arrangement with nine individual segments 17 was shown in the exemplary embodiment depicted. The same principle can be applied to other, for instance rectangular, plate and segment shapes, however. The guide element 9 must be divided into at least two segments. The maximum number of segments is determined by geometrical and economic considerations. One geometric consideration is the arrangement of the guide and attaching element on/at the respective individual segment 17. In terms of economic considerations, the complexity of the design should be reasonable. In principle the greatest possible number of individual segments 17 is optimum for good positioning with contacting.

Due to the invention, in which a segmented guide element 9 is used, the alignment of the individual microbores for receiving the test contacts 6 is improved relative to the contact surfaces 13 of the connecting device 3. Since the connecting device 3, in particular the printed circuit board 4, and the guide element 9 comprise materials having different temperature expansion coefficients, another improvement is possible. The quality of the alignment of the test contacts 6 to the contact surfaces 13 can be influenced by changing the temperature gradient, in particular of the test specimen (in particular the wafer) in the direction of the tester, in the contacting device 1. In order to have the ability to have additional influence in a given material of the holding device 11 and a given material for the guide element 9, a spacer plate or at least a spacing element made of a thermally insulating material, for instance a plastic, can be added between the holding device 11 and the guide element 9, in particular the guide plate 30. The result of this is a smaller temperature difference between the guide element 9 and the connecting device 3 and additionally a smaller deviation from room temperature. In the reverse instance, when a greater temperature difference is desired, this insulating layer can simply be omitted.

Alternatively or in addition to the aforesaid solution, the individual segments 17 of the guide element 9 can also be connected via fixed bearings 22 directly to the connecting device 3. For this, used as fixed bearings are preferably centering pins that are pinned directly to the printed circuit board 4 of the connecting device 3. The floating bearing 22 for each element can be created as desired in the manner described in the foregoing and/or using another centering pin or the like that engages in an elongated hole, to the connecting device 3, in particular the printed circuit board 4. Alternatively the centering pin can also be connected to the respective floating bearing 24 using the holding device 11 (spacer).

Due to the invention, the guide element 9, in particular the guide plate 30, is embodied in multiple parts and the position of the individual parts (segments) is determined by the holding device 11. The individual parts (individual segments 17) are guided via fixed bearing and floating bearing, the fixed bearing being connected to the holding device 11 and the floating bearing producing via a parallel guide a connection to the central element, that is, to the inner individual segment 18. The connecting line 28 that leads through associated fixed and floating bearings 22, 24, intersects the fixed bearing 22 of the central element, that is, of the inner individual segment 18. At least two or three individual segments 17 are provided, but the number can also be much greater. A practical limit ranges from 50 to 100. The holding device 11 and printed circuit board 4 can be centered on one another. The guide element 9 is preferably thermally insulated with respect to the holding device 11. The guide element 9 comprises for instance ceramic. In one variation of the invention (not shown) there is no central element, that is, there is no inner segment 18. In this case the fixed bearings and floating bearings 22, 24 are aligning elements, in particular centering pins, in the spacer, that is in the holding device 11. In this case there are at least two individual segments 17. The individual segments 17 can then be arranged in a circular in wedge shapes in a circle. These wedges then each have their tips (in contrast to the exemplary embodiment in FIG. 3).

Contrary to the exemplary embodiment in FIGS. 3 and 4, it can be provided that the centering pins that form the fixed and floating bearings 22, 24 and that position the inner individual segment 18 connect not only the latter to the holding rib 23 but also are embodied long enough that they also pin the inner individual segment 18 to the guide element 10. In contrast to this, it can also be provided that the centering pin of the floating bearing 24 is also positioned at a different location than on the holding rib 23. What is important in this is the idea that ensures that because of this measure the center of the inner individual segment 18 is disposed precisely over the center of the guide element 10 and that the inner individual segment 18 does not have any positioning error in terms of rotation relative to the guide element 10. In particular the only function of the holding rib 23 is to hold the centering pin or the centering pins vertically. The result of all of this is that the fixed bearing 22 and/or the floating bearing 24 connect, in an aligned manner, the inner individual segment 18 to the guide element 10 facing the test specimen. Fixed bearing 22 and/or floating bearing 24 can be connected to the holding device 11, in particular to the holding rib 23.

While specific examples have been described in the specification and illustrated in the drawings, it will be understood by those skilled in the art that various changes may be made and equivalence may be substituted for elements thereof without departing from the scope of the present teachings as defined in the claims. Furthermore, the mixing and matching of features, elements and/or functions between various examples may be expressly contemplated herein so that one skilled in the art would appreciate from the present teachings that features, elements and/or functions of one example may be incorporated into another example as appropriate, unless described otherwise above. Moreover, many modifications may be made to adapt a particular situation or material to the present teachings without departing from the essential scope thereof. Therefore, it may be intended that the present teachings not be limited to the particular examples illustrated by the drawings and described in the specification as the best mode of presently contemplated for carrying out the present teachings but that the scope of the present disclosure will include any embodiments following within the foregoing description and any appended claims.

What is claimed is:

1. A contacting device for touch contacting an electrical test specimen, the contacting device comprising:
    a contact head and;
    a connecting device;
    said contact head with said test specimen having electrically touch contactable test contacts, the positions of which are distributed across a testing surface and are determined by at least one guide element that belongs to said contact head and that is fastened to a holding device of said contact head;
    wherein said test contacts, on their side facing away from said test specimen, are to be brought into electrical touch contact with contact surfaces of said connecting device;
    wherein said guide element is composed of individual segments that each have a part of said testing surface and are each connected to at least one of said holding device and said connecting device by at least one fixed bearing; and
    wherein the sum of the temperature expansion coefficients of said guide element and holding device are at least approximately equal to the temperature expansion coefficient of said connecting device.

2. The contacting device of claim 1, wherein said holding device has a retaining ring and said testing surface is disposed therein.

3. The contacting device of claim 2, wherein at least one of said individual segments is connected to said retaining ring by its fixed bearing.

4. The contacting device of claim 2, wherein said retaining ring has an outline selected from the group comprising a circle and a rectangle.

5. The contacting device of claim 2, wherein said retaining ring is a complete ring or a partial ring.

6. The contacting device of claim 2, wherein at least a first individual segment is connected to said retaining ring and forms an outer individual segment, and at least a second individual segment is located inside said retaining ring, unconnected to said retaining ring and forms an inner individual segment.

7. The contacting device of claim 6, wherein said holding device has a holding rib to which at least one inner individual segment is fastened by at least one fixed bearing.

8. The contacting device of claim 7, wherein said holding rib is fastened to said retaining ring.

9. The contacting device of claim 7, wherein said holding rib runs along a diagonal of said retaining ring.

10. The contacting device of claim 6, wherein said fixed bearing of said at least one inner individual segment is disposed approximately in the center point of said testing surface.

11. The contacting device of claim 2, wherein at least one floating bearing is associated with each individual segment.

12. The contacting device of claim 11, wherein said floating bearing is a fastening provided with clearance in only one direction in said testing surface.

13. The contacting device of claim 12, wherein the fastening that is provided with clearance in only one direction in said testing plane and that forms said floating bearing is formed as a projection/recess connection for areas of said guide element, between the one individual segment and said other individual segment.

14. The contacting device of claim 11, wherein an imaginary connecting line runs between said fixed bearing and said floating bearing of each of said outer individual segments or approximately through a center point of said testing surface, the clearance for said associated floating bearing existing only in the direction of said connecting line.

15. The contacting device of claim 2, wherein at least one floating bearing is associated with each individual segment and wherein said floating bearing is embodied between at least one individual segment and said holding device and/or said connecting device on the one hand and/or between at least one individual segment and at least one other individual segment on the other hand.

16. The contacting device of claim 2, wherein said fixed bearing is a clearance-free fastening in said testing surface.

17. The contacting device of claim 2, wherein said guide element has a temperature expansion coefficient that differs from that of said connecting device.

18. The contacting device of claim 2, wherein said holding device has a different temperature expansion coefficient from said guide element.

19. The contacting device of claim 2, wherein said connecting device is embodied as a printed circuit board.

20. The contacting device of claim 19, wherein said contact surfaces are made from conductor surfaces of said printed circuit board.

21. The contacting device of claim 2, wherein said test contacts are buckling test needles.

22. The contacting device of claim 2, wherein said guide element is a guide plate.

23. The contacting device of claim 1, wherein the temperature expansion coefficient of said holding device is selected such that touch contacting within a temperature range is possible between said test contacts and said contact surfaces of said connecting device.

24. A method for touch contacting an electrical test specimen, comprising:
    providing a contacting device having a contact head and a connecting device, said contact head with said test specimen having electrically touch contactable test contacts, the positions of which are distributed across a testing surface and are determined by at least one guide element that belongs to said contact head and that is fastened to a holding device of said contact head, and wherein said test contacts, on their side facing away from said test specimen, are to be brought into electrical touch contact with contact surfaces of said connecting device, wherein said guide element includes individual segments moveable relative to each other that each have a part of said testing surface;

connecting each said individual segment with at least one of said holding device and said connecting device by at least one fixed bearing;

connecting each said individual segment with a floating bearing that permits movement of said individual segment along an axis; and contacting the electrically touch contactable test contacts with the electrical test specimen.

25. The method for touch contacting an electrical test specimen of claim 24, further comprising isolating temperature induced expansion of the individual segments to the respective individual segments, thereby reducing deviations in a dimension of the testing surface.

26. The method for touch contacting an electrical test specimen of claim 24, wherein permitting movement along said axis includes permitting movement along an axis extending through said fixed bearing, said floating bearing, and proximate to a center of said testing surface.

27. A guide element of a contacting device for touch contacting an electrical test specimen, the guide element comprising:

a plurality of individual segments cooperating to define a test surface, the plurality of individual segments including an inner segment and a plurality of outer segments;

a holding device circumferentially surrounding the plurality of outer segments, each outer segment of the plurality of outer segments connected to the holding device at a fixed bearing; and a floating bearing disposed between at least one of said plurality of outer segments and said inner segment to permit relative movement between said at least one outer segment and said inner segment along an axis.

28. The guide element of a contacting device for touch contacting an electrical test specimen of claim 27, wherein the inner segment is generally circular and the plurality of outer segments radially surround the inner segment.

29. The guide element of a contacting device for touch contacting an electrical test specimen of claim 27, wherein said axis extends through said fixed bearing, said floating bearing, and proximate to a center of said inner segment.

* * * * *